United States Patent [19]

Chu et al.

[11] Patent Number: 5,734,594
[45] Date of Patent: Mar. 31, 1998

[54] METHOD AND SYSTEM FOR ENHANCEMENT OF WAFER ALIGNMENT ACCURACY

[75] Inventors: Ron-Fu Chu, Singapore, Singapore; Zadig Cheung-Ching Lam, Arcadia, Calif.

[73] Assignee: Chartered Semiconductor Manufacturing Pte Ltd., Singapore, Singapore

[21] Appl. No.: 719,384

[22] Filed: Sep. 25, 1996

[51] Int. Cl.$^6$ .................................................. G01B 7/00
[52] U.S. Cl. .................. 364/559; 364/575; 356/401; 250/491.1
[58] Field of Search .......................... 364/559, 571.01, 364/575, 167.01, 474.34, 474.35, 468.28; 250/491.1; 348/95; 382/151; 356/399–401

[56] References Cited

U.S. PATENT DOCUMENTS

| | | | |
|---|---|---|---|
| 3,901,814 | 8/1975 | Davis et al. | 250/492 |
| 4,170,418 | 10/1979 | Aiuchi et al. | 356/400 |
| 4,301,470 | 11/1981 | Pagany | 364/559 |
| 4,475,122 | 10/1984 | Green | 358/101 |
| 4,595,295 | 6/1986 | Wilczynski | 356/401 |
| 4,723,221 | 2/1988 | Matsuura et al. | 364/559 |

*Primary Examiner*—James P. Trammell
*Attorney, Agent, or Firm*—George O. Saile; Stephen B. Ackerman; Graham S. Jones, II

[57] ABSTRACT

This computer system, as well as its method of operation, corrects the position data used to define the location of alignment marks on a workpiece. The first step is to scan marks along a first direction to determine the direction of wafer scaling along the first direction. Second, scan marks along a second direction to determine the direction of wafer scaling along the second direction. Next, scan a first set of alignment marks on a workpiece oriented in a first direction and a second set of alignment marks on the workpiece oriented in a second direction in an initial sequence to collect initial direction data on the location. Then, scan the first set of alignment marks and the second set of alignment marks in a reverse sequence to collect reverse direction data on the location. Finally, average the initial direction data and the reverse direction data. This enables correction of false alignment data attributable to falsely measured locations of alignment marks.

6 Claims, 4 Drawing Sheets

5,734,594

1

METHOD AND SYSTEM FOR ENHANCEMENT OF WAFER ALIGNMENT ACCURACY

BACKGROUND OF THE INVENTION

1. Field of the Invention

This invention relates to alignment in photolithography and more particularly to making corrections for distortions of alignment of registration marks.

2. Description of Related Art

In mask alignment systems marks are provided on the workpiece for use in aligning a photolithographic reticle/mask with a workpiece comprising a semiconductor wafer using an optical alignment system. During the process of manufacture various layers are formed over the wafer various factors such as expansion or shrinkage of the successive layers can alter the location of the alignment marks in the successive layers. Thus the marks, as detected by the optical alignment system, can lead to errors.

SUMMARY OF THE INVENTION

A computer method of corrects position data defining the location of alignment marks on a workpiece. The steps of the method include the steps as follows:

Scan marks along a first direction to determine the first direction wafer scaling along the first direction. Then scan marks along a second direction to determine the second direction wafer scaling along the second direction. Next, in an initial sequence scan a first set of alignment marks on a workpiece oriented in a first direction and a second set of alignment marks on a workpiece oriented in a second direction to collect initial direction data on the location; and scan the first set of alignment marks and the second set of alignment marks in a reverse sequence to collect reverse direction data on the location. Then average the initial and reverse direction data so that the false alignment data attributable to false measured locations of alignment marks is corrected.

In accordance with another aspect of this invention, a system for alignment of a workpiece during photolithography and for correcting position data defining the location of alignment marks on a workpiece comprises the following system. Means are provided for scanning marks along a first direction to determine the first direction wafer scaling along the first direction. In addition, means are provided for scanning marks along a second direction to determine the second direction wafer scaling along the second direction. Means for scanning a first set of alignment marks on a workpiece oriented in a first direction are provided and means for scanning a second set of alignment marks on a workpiece oriented in a second direction are provided in an initial sequence to collect initial direction data on the location. Means are provided for scanning the first set of alignment marks and the second set of alignment marks in a reverse sequence to collect reverse direction data on the location. Means are also provided for averaging the initial and the reverse direction data, whereby false alignment data attributable to false measured locations of alignment marks is corrected.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
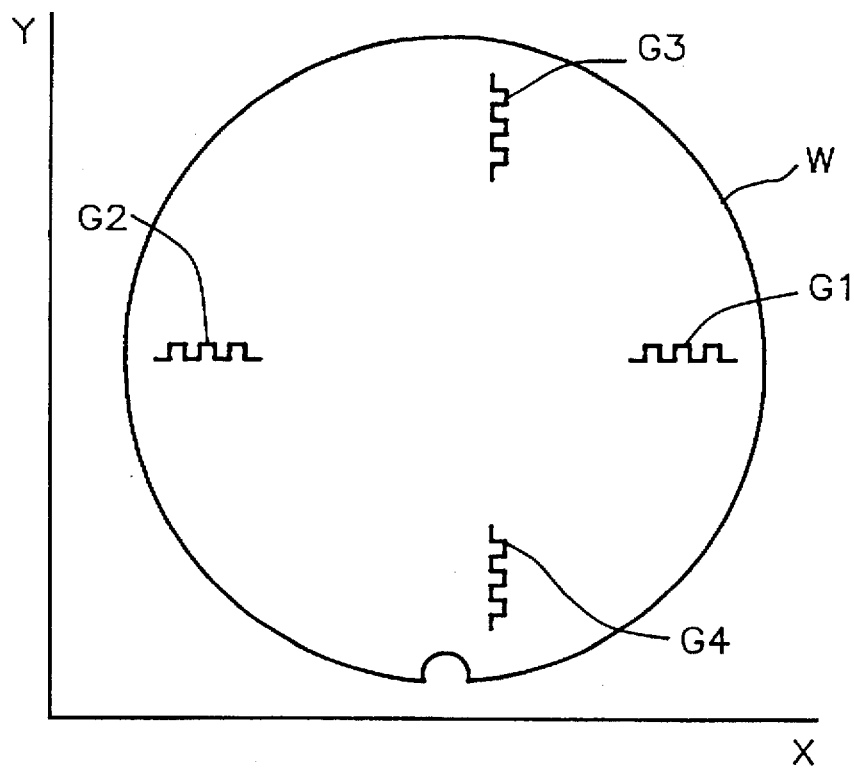
FIG. 1A shows a silicon semiconductor wafer with a set of four grating marks (line and space) with two marks for the x axis and with two marks for the y axis formed thereon.

FIG. 1A shows a silicon semiconductor wafer W, having formed thereon, a set of four grating marks (line and space) on the surface of wafer W. FIG. 1A shows two horizontally extending marks G1 and G2 for the x axis and with two vertically extending marks G3 and G4 for the y axis.

Figure 1B:
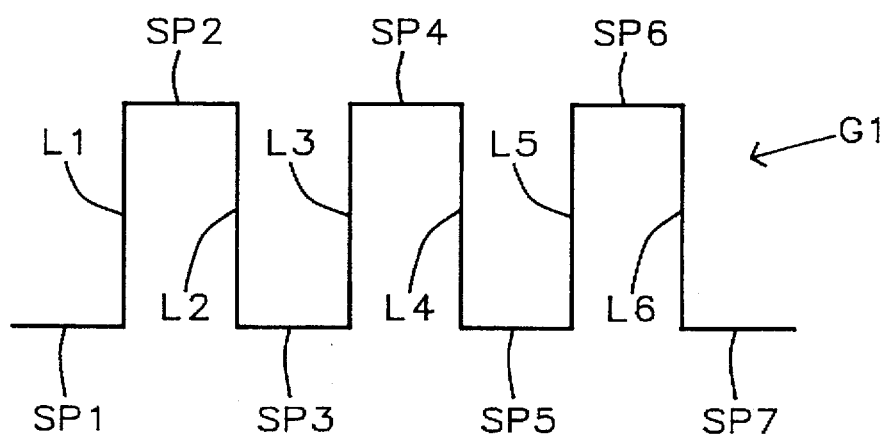
FIG. 1B shows an enlargement of the horizontally extending marks for the x axis of FIG. 1A.

FIG. 1B shows an enlargement of the horizontally extending mark G1 of FIG. 1A with an array of vertically extending, equally spaced, parallel lines L1, L2, L3, L4, L5 and L6 separated by horizontally extending "spacer lines" which marking the spaces between parallel lines L1, L2, L3, L4, L5 and L6. Horizontally extending spacer lines SP1, SP2, SP3, SP4, SP5, SP6 and SP7 alternately connect the tops and bottoms of the array of parallel lines L1, L2, L3, L4, L5 and L6. Spacer line SP1 connects to the lower end of line L1 extending to the left, whereas spacer line SP2 connects the upper ends of lines L1 and L2. At the lower end of line L2, spacer line SP3 connects the lower ends of lines L2 and L3. At the upper end of line L3, spacer line SP4 connects the upper ends of lines L3 and L4. At the lower end of line L4, spacer line SP5 connects the lower ends of lines L4 and L5. At the upper end of line L5, spacer line SP6 connects the upper ends of lines L5 and L6. At the lower end of line L6, spacer line SP7 connects to the lower end of line L7 extending to the right. Horizontally extending spacer lines SP1, SP3, SP5, and SP7 are aligned along a first lower invisible line. Horizontally extending spacer lines SP2, SP4, and SP6 are aligned along a second upper invisible line. The mark G2 is identical to mark G1 and marks G3 and G4 are also identical but are rotated by 90° in the plane of the page from the mark G1.

Figure 2:
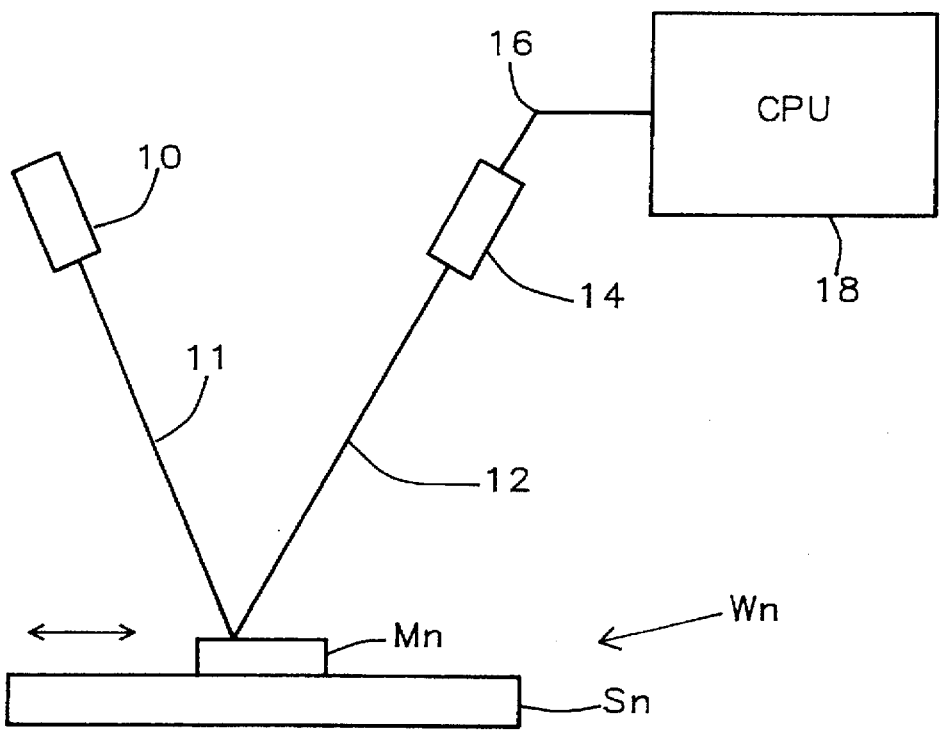
FIG. 2 shows a scanner comprising a photoelectric and computer control system for detecting workpiece location with a portion of a mark in accordance with this invention.

FIG. 2 shows a scanner comprising a photoelectric and computer control system for detecting the location of substrate Sn of a workpiece Wn with a mark Mn (of which a portion is shown) thereon. A light (preferably a laser) beam 11, focussed from a light source 10 (preferably a laser), is directed down at an angle at the top surface of mark Mn on substrate Sn. A portion of light beam 11 is reflected from the mark Mn as a reflected light beam 12. Reflected light beam 12 is detected by a photosensor 14, which is focussed on the surface of workpiece Wn including the mark Mn. Photosensor 14 comprises a photoelectric transducer. The output of photosensor 14 is connected by electrical conductor line 16 to the input of a computer (CPU) 18 provided to be used in alignment of workpiece Wn relative to the light beam 11.

Figure 3A:
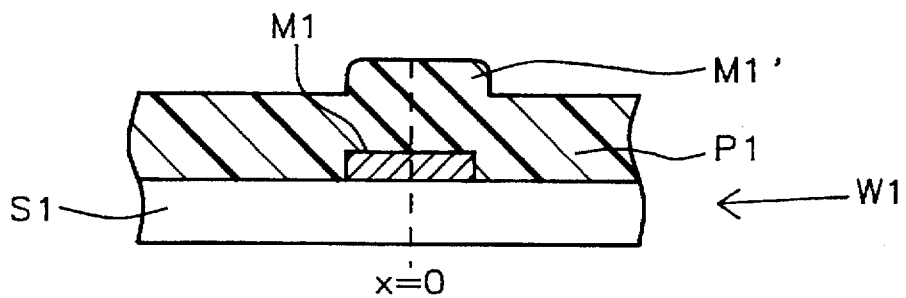
FIG. 3A shows a first three dimensional mark on a substrate of a first workpiece and FIG. 3B shows another three dimensional mark on a substrate of another workpiece.

FIG. 3A shows a three dimensional mark M1 on a substrate S1 of a workpiece W1. Mark M1 projects above the surface of substrate S1. A polymeric photoresist layer P1 is formed over the mark M1. Layer P1 includes a three dimensional mark M1' projecting above the surface of photoresist layer P1. Mark M1' corresponds in shape to mark M1 and is aligned perfectly with the mark M1.

Figure 3B:
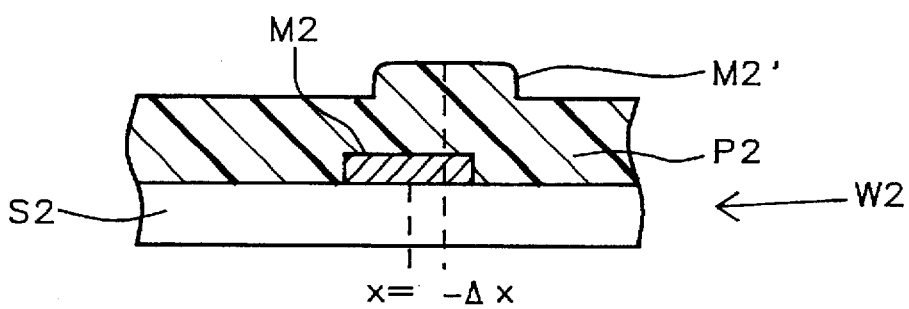

FIG. 3B shows a three dimensional mark M2 on a substrate S2 of a workpiece W2. Mark M2 projects above the surface of substrate S2. A polymeric photoresist layer P2 is formed over the mark M2. Layer P2 includes a three dimensional mark M2' projecting above the surface of photoresist layer P2. The mark M2' formed in thin film P2 is not deposited symmetrically on top of the grating mark M2, the alignment signal generated by photocell 14 and transmitted to the CPU 18 will indicate an incorrect location and that will result in a false placement correction and cause misalignment. In other words, because although mark M2' corresponds in shape to mark M2, it is misaligned with the mark M2 by a distance as follows:

$$x = -(delta)x$$

Figure 4A:
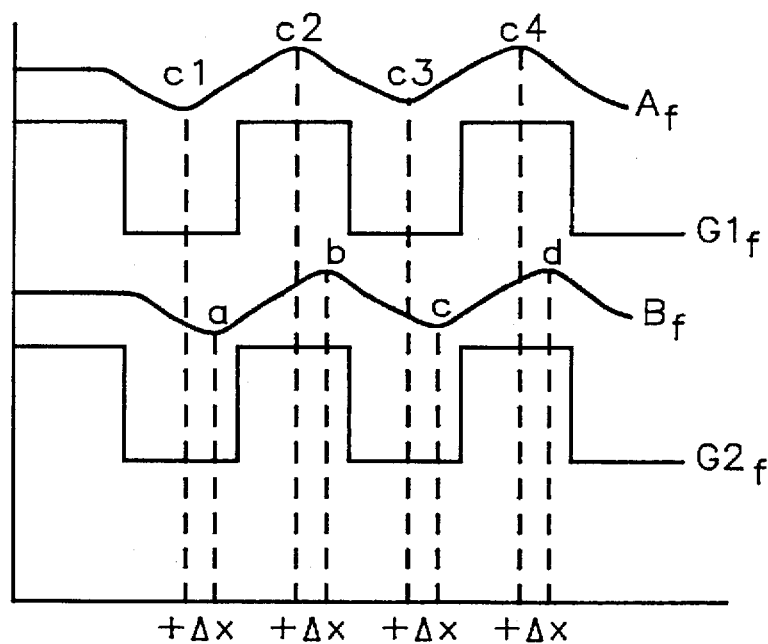
FIG. 4A is a graph of variations of several parameters as a function of the x axis in FIG. 2 for scanning the x-axis marks in a first direction.
Figure 4B:
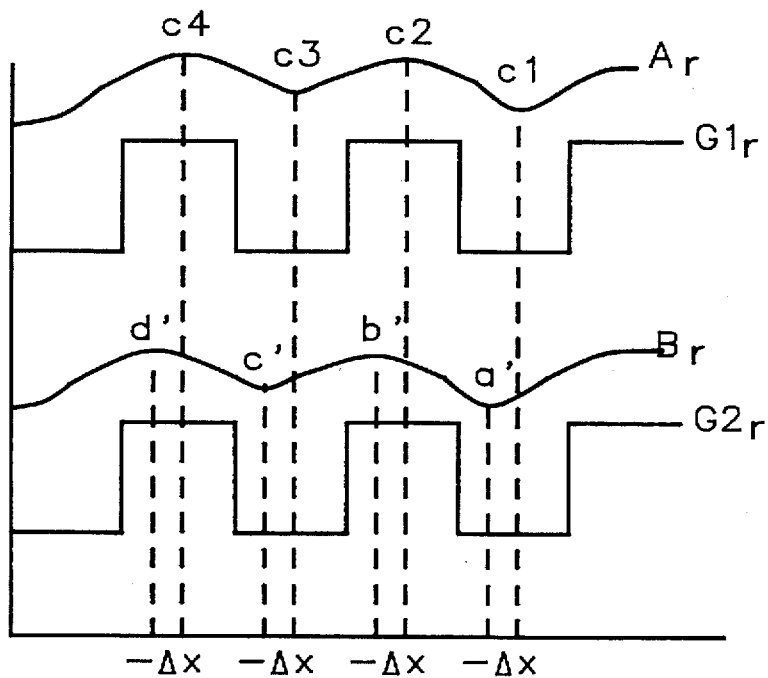
FIG. 4B is a graph of variations of the parameters as a function of the x axis in FIG. 2 for scanning the x-axis marks in the reverse direction.

It is the error seen in FIG. 4B for which correction is provided by the present invention.

FIG. 4A is a graph of variations of several parameters as a function of the x axis of the device of FIG. 2 when scanning the x-axis marks G1 and G2 in a first direction.

FIG. 4A shows curves for forward scans $G1_f$ and $G2_f$ for original grating marks G1 and G2 which are used in a masking process to register patterns, when scanned in a first (forward) direction. For a scan of mark G1 the resulting curve $A_f$ produced by the scanner of FIG. 2 shows the kind of scan which can be achieved when a layer formed over the grating mark G1 is located accurately, so centerlines c1, c2, c3 and c4 are centered halfway between the vertical lines of the grating mark G1 in FIG. 4A. But for mark G2 the curve $B_f$ produced by the scanner is shifted by +(Delta) x as indicated by maxima and minima points a, b, c, and d on curve $B_f$ relative to the centerlines c1, c2, c3 and c4 of grating mark G2 in FIG. 4A.

FIG. 4B is a graph of variations of several parameters as a function of the x axis of the device of FIG. 2 when scanning the x-axis marks G1 and G2 in the reverse direction.

FIG. 4B shows the reverse direction scan $G1_r$ and $G2_r$ of marks G1 and G2 as contrasted to the direction of scan of the grating marks $G1_f$ and $G2_f$ in FIG. 4A. The reverse scan of the marks G1 and G2 produces curves $A_r$ and $B_r$ respectively with the centerlines c4, c3, c2 and c1 reversed (from centerlines c1, c2, c3 and c4) and the maxima and minima points d', c', b', and a' also reversed (from maxima and minima points a, b, c, and d). Curve $A_r$ shows the kind of scan which can be achieved when a layer formed over the grating marks G1 is placed accurately, so centerlines c4, c3, c2 and c1 are centered halfway between the vertical of grating mark G1 in FIG. 4B. But curve $B_r$ is shifted by −(Delta) x as indicated by points d', c', b', and a' relative to the centerlines c4, c3, c2 and c1 grating marks of curve $G2_r$ in FIG. 2, which is the equal and opposite value to that of the shift of +(Delta) x in FIG. 4A.

In accordance with this invention, a method is provided which creates a new set of alignment data which reverse the original alignment sequence. The original data and the data from the reversed alignment sequence produce two sets of alignment data which then average out. That is to say that if there are reversed non-symmetrical grating marks, the non-symmetrical marks will cancel each other and eliminate false alignment correction.

SUMMARY (1) Current alignment procedures use mark (1) and (2) to determine X direction wafer scaling and (3) and (4) for Y direction scaling.

(2) The alignment sequence is performed in an initial direction.

Example A

The system scans the marks in FIG. 1A in the sequence (1)-(2)-(3)-(4).

If there is a lack of symmetry the marks will cause faulty adjustment of wafer position.

(2) Then an additional alignment scanning sequence is performed.

Example B

The system scans the marks in FIG. 1A in the sequence (4)-(3)-(2)-(1).

If there are non-symmetrical marks, the set of data from step (2) will cancel the data from the first sequence in step (1). (3) The average of these two sets of alignment data can provide higher accuracy of pattern registration.

Figure 5:
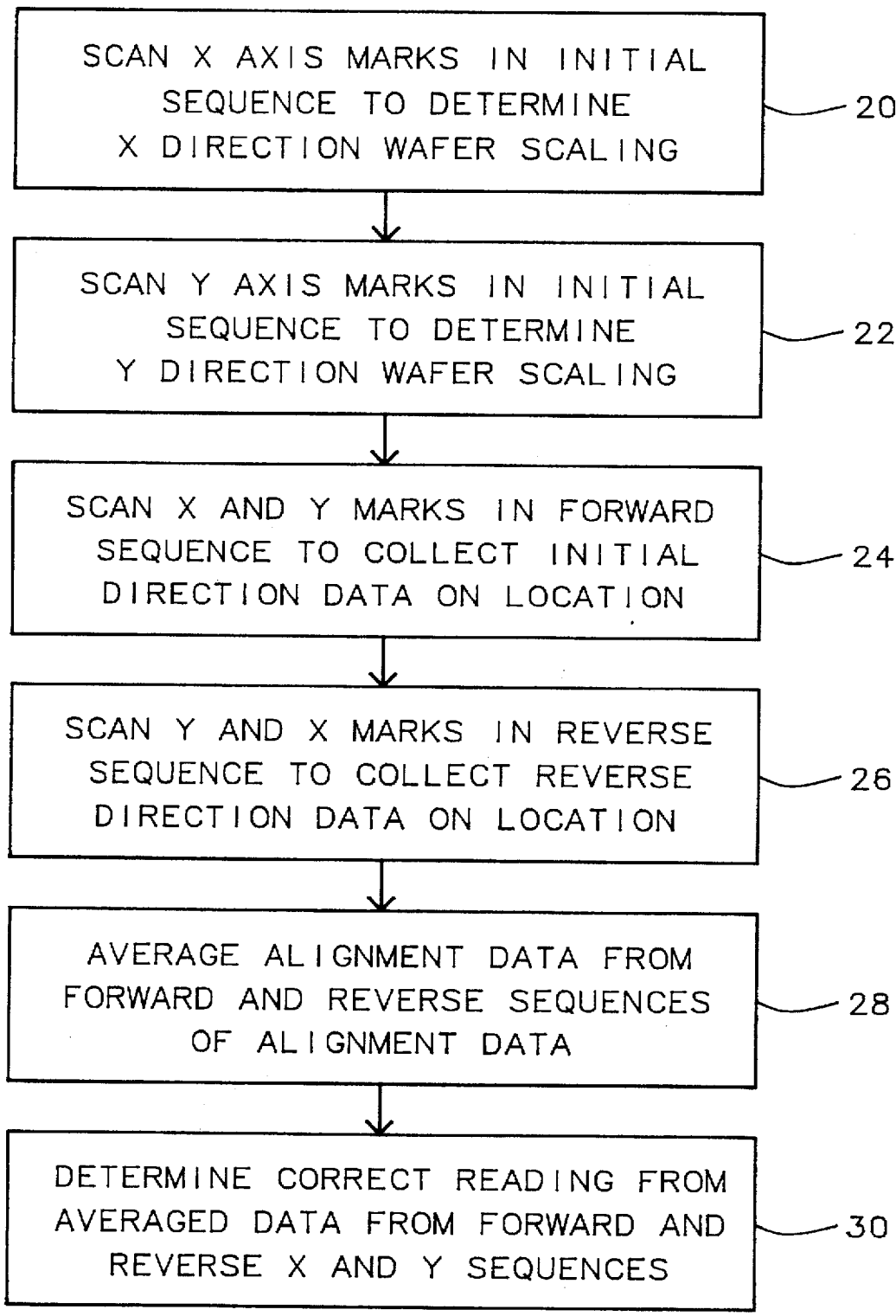
FIG. 5 shows a flow chart for a computer operated alignment process in accordance with this invention.

Referring to FIG. 5, a computer operated alignment process in accordance with this invention commences with a first step 20 which scans the x axis marks (e.g. G1 and G2) in an initial sequence to determine x direction wafer scaling. G1 is moved to the same location as G2 and is scanned the same way as G2.

The second step 20 is to scan y axis marks (e.g. G3 and G4) in an initial sequence to determine y direction wafer scaling 22. G3 is moved to the same location as G4 and is scanned the same way as G4.

Next in step 24 the computer system and the alignment system scan the x and y marks in an initial sequence (e.g. G1, G2, G3 and G4 in a initial sequence) to collect initial direction data on location. G4 is moved to the same location as G3 and is scanned the same way as G3.

In step 26, the computer system and the alignment system scan y and x marks (e.g. G4, G3, G2 and G1) in a reverse sequence to collect reverse direction data on location. The wafer stage moves marks to the fixed position for laser 10 in FIG. 2 to scan marks. Thus, busy marks are scanned when identical conditions exist.

In step 28, the computer system and the alignment system provide an average value based on the alignment data from the data from initial and reverse sequences of alignment data.

The function provided by the computer for the determination in step 28 is as follows:
Scaling Correction:

1. Scan G2→A value Example: −0.4 μm
2. Scan G1→B value Example: +0.4 μm

Computer B−A=+0.4−(−0.4)=+0.8 μm=>X1

The steps of the method used by the computer to average the initial data and the reverse sequence of data on the location of the alignment marks are that the computer system determines the distance d1 of measured marks G1 and G2 and compares the distance d1 to a preset distance d0 in the computer as follows:

If d1>d0, then there is expansion.

If d1<d0, then there is shrinking.

In step 28, the computer system determines the correct reading from averaged data from initial and reverse x and y sequences 30.

Reverse Scaling Correction:

1. Scan G1→C value Example: +0.4 μm
2. Scan G2→D value Example: −0.4 μm

Computer D−C=−0.4−(+0.4)=−0.8 μm=>X2

Computer X1+X2=0

Thus, the scaling error due to film deposition is eliminated.

SUMMARY

The problem with alignment marks in photolithography is caused when there expansion or shrinkage along the x axis or the y axis. If there is a false reading in for example the X direction caused by "shrinkage" of the surface formed over then alignment mark, when the algorithm reverses the sequence of scanning, the reading will show an "expansion". Data goes to the computer 18 which then detects the false reading and corrects the error.

If there is an additional, more severe problem than misalignment the computer 18 can recognize that there is such a problem. The computer has an algorithm to identify various type of misalignments. Typically, like x, y shift, rotation and scaling, this method applies only to scaling misalignment, so it will not affect other components of misalignments.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A computer method of correcting position data defining the location of alignment marks on a workpiece, including the steps performed in the sequence as follows:

performing a scan of wafer scaling in said first direction, performing a scan of wafer scaling in said second direction, performing, in a forward scan, the steps of scanning a first set of alignment marks on a workpiece oriented in a first direction and scanning a second set of alignment marks on a workpiece oriented in a second direction in an forward sequence to collect forward direction data on said location, performing, in a reverse scan, the steps of scanning said first set of alignment marks and said second set of alignment marks in a reverse sequence to collect reverse direction data on said location, and averaging said initial direction data and said reverse direction data, whereby false alignment data attributable to false measured locations of alignment marks is corrected.

2. A computer method in accordance with claim 1 wherein: following the step of averaging alignment data, performing the step of determining the correct reading from averaged data from forward and reverse sequences.

3. A computer method of correcting position data defining the location of alignment marks on a workpiece, including the steps comprising:

scanning marks along a first direction to determine first direction wafer scaling along said first direction, scanning marks along a second direction to determine second direction wafer scaling along said second direction, scanning a first set of alignment marks on a workpiece oriented in a first direction and a second set of alignment marks on a workpiece oriented in a second direction in an initial sequence to collect initial direction data on said location, scanning said first set of alignment marks and said second set of alignment marks in a reverse sequence to collect reverse direction data on said location, and averaging said initial direction data and said reverse direction data, whereby false alignment data attributable to false measured locations of alignment marks is corrected.

4. A system for alignment of a workpiece during photolithography and for correcting position data defining the location of alignment marks on a workpiece wherein prior to said forward scan means for performing the functions as follows:

means for performing a scan of wafer scaling in said first direction, means for performing a scan of wafer scaling in said second direction, means for scanning a first set of alignment marks on a workpiece oriented in a first direction and a second set of alignment marks on a workpiece oriented in a second direction in an initial sequence to collect initial direction data on said location, means for scanning said first set of alignment marks and said second set of alignment marks in a reverse sequence to collect reverse direction data on said location, and means for averaging said initial direction data and said reverse direction data, whereby false alignment data attributable to false measured locations of alignment marks is corrected.

5. A computer system in accordance with claim 4 wherein: following the operation of the means for averaging alignment data, operating means for determining the correct reading from averaged data from forward and reverse sequences.

6. A system for alignment of a workpiece during photolithography and for correcting position data defining the location of alignment marks on a workpiece comprising:

means for scanning marks along a first direction to determine first direction wafer scaling along said first direction, means for scanning marks along a second direction to determine second direction wafer scaling along said second direction, means for scanning a first set of alignment marks on a workpiece oriented in a first direction and a second set of alignment marks on a workpiece oriented in a second direction in an initial sequence to collect initial direction data on said location, means for scanning said first set of alignment marks and said second set of alignment marks in a reverse sequence to collect reverse direction data on said location, and means for averaging said initial direction data and said reverse direction data, whereby false alignment data attributable to false measured locations of alignment marks is corrected.

* * * * *